United States Patent [19]
Takagi

[11] Patent Number: 5,972,116
[45] Date of Patent: Oct. 26, 1999

[54] METHOD AND APPARATUS FOR PRODUCING A SEMICONDUCTOR DEVICE

[75] Inventor: Mikio Takagi, Kanagawa, Japan

[73] Assignee: F.T.I. Co., Ltd., Kanagawa, Japan

[21] Appl. No.: 08/579,851

[22] Filed: Dec. 28, 1995

[30] Foreign Application Priority Data

Dec. 29, 1994 [JP] Japan .................................. 6-339005

[51] Int. Cl.$^6$ .................................................. C23C 16/00
[52] U.S. Cl. ........................ 118/719; 118/725; 118/729; 427/255.1
[58] Field of Search ................... 427/255.1; 118/719, 118/725, 729

[56] References Cited

U.S. PATENT DOCUMENTS

| | | | |
|---|---|---|---|
| 4,593,168 | 6/1986 | Amada | 219/10.55 M |
| 5,134,092 | 7/1992 | Matsumoto et al. | 437/192 |
| 5,164,012 | 11/1992 | Hattori | 111/725 |
| 5,387,557 | 2/1995 | Takagi | 427/247 |
| 5,445,676 | 8/1995 | Takagi | 118/719 |
| 5,484,484 | 1/1996 | Yamaga et al. | 118/719 |
| 5,551,984 | 9/1996 | Tanahashi | 118/724 |
| 5,750,436 | 5/1998 | Yamaga et al. | 438/558 |

*Primary Examiner*—C. H. Kelly
*Attorney, Agent, or Firm*—Armstrong, Westerman, Hattori, McLeland and Naughton

[57] ABSTRACT

In a method for producing a semiconductor device using a dual tube reactor, inert gas is fed into the vertical reaction-tube, a reaction gas is introduced into the vertical reaction-tube, the inert gas is exhausted through the annular channel formed between the inner tube and the outer tube at a bottom portion of the vertical reaction-tube; and, a wafer is heat treated in the vertical reaction-tube by means of a heating furnace. In order to decrease the number and size of the particles, the wafer is displaced upward and then positioned at a level substantially the same as or above the top end of the inner tube, and the reaction gas is introduced into the vertical reaction-tube at or above the position of the wafer. Furthermore, the inert gas is caused to flow from a bottom portion of the inner tube toward the wafer positioned as above. As a result, inflow of the reaction gas into the inner tube is impeded, and the generation of particles there can be lessened.

27 Claims, 14 Drawing Sheets

Fig. 12
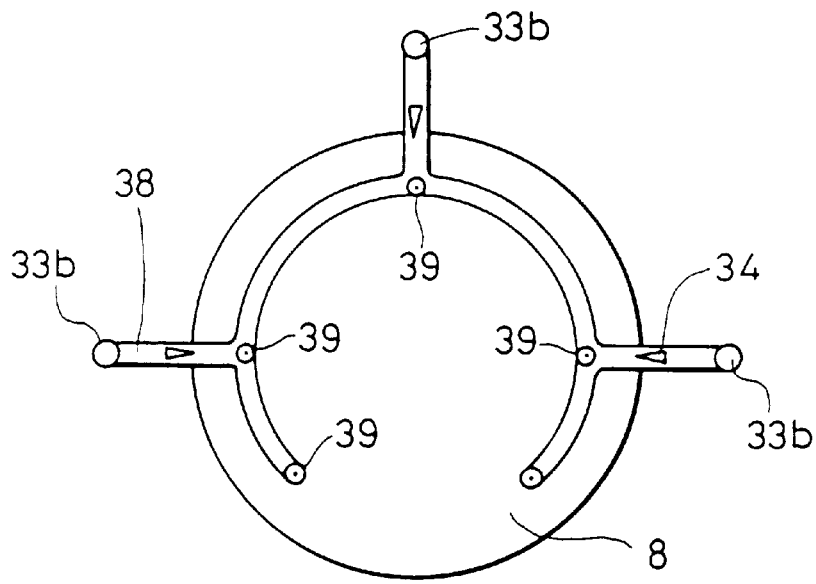
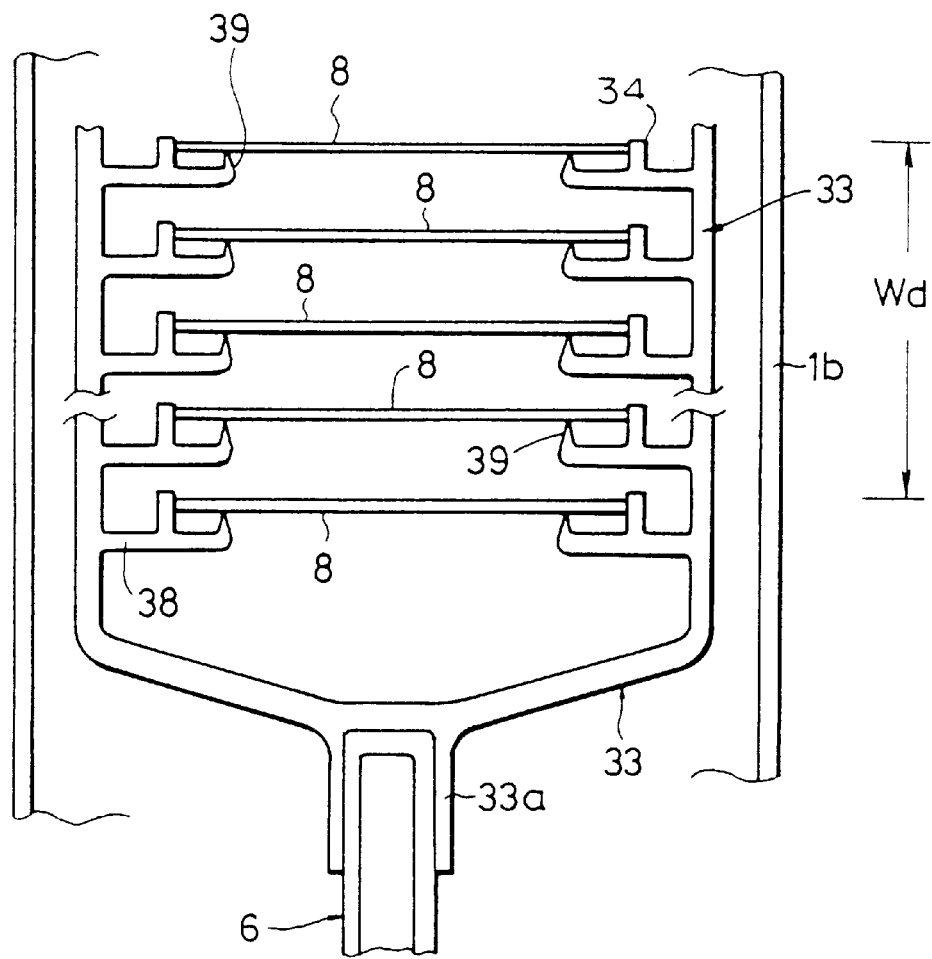

METHOD AND APPARATUS FOR PRODUCING A SEMICONDUCTOR DEVICE

BACKGROUND OF INVENTION

1. Field of Invention

The present invention relates to a method and apparatus for producing a semiconductor device. More particularly, the present invention relates to a vertical type apparatus for producing, by using a silicon- or compound-semiconductor, devices such as a memory device, a logic circuit IC, a thin-film transistor IC, and the like, as well as relates to a method for producing a semiconductor device in such an apparatus.

In such an apparatus, a film or a layer consisting of semiconductor material, insulating material, metallic material, super-conducting material or the like is formed on a wafer using a reaction gas under normal or reduced pressure. Such heat treatments as diffusion, improvement of the film properties, and flattening of a film are also carried out under the presence of a protective gas. The present invention provides a method for decreasing the particles in such an apparatus and method as described above.

The "reaction gas" herein means, as usual: gases which react with one another to form the film or layer; gas or gases which decompose to form the film or layer; gas or gases which react with a wafer to form the film or layer. The gas or gases mean not only the atom or molecule as usual but also the species in the state of ions or radicals. The "inert gas" herein means the gas, whose reaction with the wafer is not intended or which does not impede the function of the reaction gas as described above. The inert gas may be Ar or the like or may be nitrogen which does not react with a wafer under a certain kind of the heat treatment.

2. Description of Related Arts

Japanese Unexamined Patent Publications Nos. 53-51187 and 65-20282 disclose apparatuses for producing a semiconductor device. These apparatuses are rather old and incur a considerable temperature fall at one of the ends of a reaction tube, i.e., the exhaust end. The film incidentally formed on the inner wall of the exhaust end has a quality considerably different from the one formed on a wafer as a result of the reaction. As a result, the particles sprinkle in the reaction chamber.

In the late 1970s and early 1980s, an evacuated CVD apparatus usually referred to as Anicon was frequently used. In this apparatus, a vertically movable upper furnace of an electrical resistance heating type and a stationary lower heating furnace are fixed air-tight to one another, but are also separable. An exhaust tube is aligned to the central axis of the upper and lower furnaces. The lower furnace is fixed to a lower portion of the exhaust tube. The upper portion of the exhaust tube protrudes into the inner space of the upper furnace. Small inlet tubes of reaction gas are fixed in the exhaust tube concentrically. A wafer carrier made of quartz is held above the exhaust tube in a central portion of the furnace. The wafer carrier is in the form of a drain board and can carry a number of wafers. The attained dispersion in thickness of the film formed on the wafers is ±2% which is excellent in the above-mentioned era. However, when the upper and lower furnaces are separated to take out the wafers, a great temperature difference is generated between the interior and exterior of the apparatus. A considerable hot air blast therefore generates and deposits particles of reaction product particles on the wafers in a great amount.

Contrary to this, a dual-tube type apparatus for producing a semiconductor device is recommended, because the generation of particles is very slight. More specifically, in the dual-tube type apparatus the outer tube has a top closed except for the gas inlet where a gas conduit opens, and an annular channel is formed between the inner and outer tubes. The annular channel is communicated with the tubular space of the inner tube via a space above the top end of the inner tube. According to the so-formed furnace structure, the reaction gas is withdrawn through the annular channel, and almost all of the particles can be confined in this annular channel, as is disclosed in European Patent Publication 0538874 filed by the present applicant.

FIG. 17 is a drawing illustrating a conventional method and apparatus for producing a semiconductor device using a dual-tube type apparatus.

Referring to FIG. 17, a method for heat treating a wafer in an apparatus disclosed in said European publication is illustrated. A dual reaction-tube 1 comprises an outer tube 1a and an inner tube 1b. An inlet conduit of the reaction gas 2 opens at the bottom of the inner tube 1b. The exhaust tube 3 opens at the bottom of the outer tube 1a. The annular channel 4 is formed between the concentrical, outer tube 1a and inner tube 1b and guides the reaction gas into the exhaust tube 3. The heating furnace is denoted by 5. The wafer holder is denoted by 6 and holds a wafer 8. The wafer 8 held at the position shown in FIG. 17 is brought into contact with and caused to react with the reaction gas which is caused to flow upward in the inner tube 1b. The intended reaction thus occurs. After the reaction, the reaction gas is caused to flow downward through the annular channel 4 and is withdrawn through the exhaust tube 3. Any particles, which may result from the reaction, therefore deposit on the tube wall of the annular channel 4. Since the vertical wall of inner tube 1b is present between the annular channel 4 and the tubular space of inner tube 1b, into which and from which the wafer 8 enters and is taken out, the influence of the particles on the wafer 8 can be decreased.

Allegedly, a large diameter wafer, for example a 12-inch wafer, is necessary for producing a 64M-DRAM in order to fulfill the multiple rule for cost reduction. Therefore, approximately 200 chips must be produced on a 12 inch wafer ("Nikkei Microdevice" November 1992). The integrating degree of a semiconductor device thus increases more and more. Since the particles have a coefficient of thermal expansion different from that of the quartz and, further, the adhesive force of the particles on the quartz is small, the number and size of the particles should be decreased as much as possible along with increase of the integration degree. This in turn makes it necessary to produce a semiconductor device in a small batch or in a treatment of a single wafer. The plant cost of an apparatus used for such production should not be increased.

Usually, when such treatment as CVD is carried out tens of times in a quartz reaction tube, the reaction product deposits thickly on the inner wall of the reaction tube to a thickness of approximately several tens of microns. The thus deposited reaction product peels due to the difference between the coefficient of thermal expansion of quartz of the reaction tube and that of the reaction product. In order to prevent the formation of particles, the reaction product deposited on the inner wall must be decomposed before it results in the formation of particles. The decomposition is carried out, for example, by plasma, which must be frequently carried out. This cleaning method is published in Japanese Unexamined Patent Publication No. 62-196,820, in which it describes a method to permanently install between a heater and the outer tube an electrode for generating plasma.

In the heat-treating method of a wafer disclosed in such a dual-tube type apparatus for producing a semiconductor device shown in FIG. 17, the reaction gas is caused to flow within the inner tube 1b, in which a wafer 8 is situated. The reaction therefore occurs within the inner tube 1b. As a result, the reaction product deposits somewhat on the inner wall of the inner tube 1b. The reaction occurs most actively at a location of the inner tube where the wafer 8 is positioned during the reaction, while the reaction occurs less actively deeper within the inner tube 1b where the wafer 8 is introduced and withdrawn. The superfluous reaction product deposits on the inner wall of the inner tube 1b. When the wafer 8 is withdrawn from the dual type reaction tube 1 by means of driving the mechanisms 30–33 described below, the wafer 8 is contaminated by the particles deposited on the inner wall of the inner tube 1b. The wafer 8 is also contaminated by the particles, when it is inserted into the dual type reaction tube 1. In FIG. 17, a magnet coil is denoted by 30, an outer tube is denoted by 31, and, a driving mechanism is denoted by 32. The wafer holder 6 is elevated or lowered by the mechanism 33, together with the shielding plate 11 and the pedestal 12.

According to a known method for cleaning the dual-tube type apparatus by plasma, the electrodes for cleaning are permanently installed between the outer tube and the heating furnace. The plasma generates, therefore, most intensively in the space between the inner and outer tubes, with the result that the inner wall of the inner tube is not cleaned effectively. Note that the inner wall should be cleaned, since the amount of deposition of the particle source there is great. The known cleaning method is therefore not satisfactory.

SUMMARY OF THE INVENTION

It is therefore an object of the present invention to provide a method for producing a semiconductor device by using a dual-tube type reaction apparatus, in which method the contamination of a wafer by particles is furthermore suppressed.

It is another object of the present invention to provide a dual-tube type reaction apparatus which is improved to furthermore suppress the contamination of a wafer by particles.

In accordance with an object of the present invention there is provided a method for producing a semiconductor device, comprising the steps of:

feeding an inert gas into a vertical reaction-tube comprising an inner tube and an outer tube, which tubes form therebetween an annular channel communicating with the space of the inner tube via a space above the top end of the inner tube;

introducing a reaction gas into the vertical reaction tube;

exhausting the inert gas through the annular channel; and, heating the vertical reaction tube by means of a heater;

heat treating a wafer or wafers in said vertical reaction-tube under the presence of the reaction gas;

said method further comprising the steps of:

vertically displacing said wafer or wafers upward and then positioning said wafer or wafers in the vertical reaction tube at a level substantially the same as or above the top end of the inner tube;

introducing said reaction gas into said vertical reaction tube at or above the position of the wafer or wafers;

causing a reaction with the reaction gas to occur on said wafer or wafers positioned as above;

causing said inert gas to flow from the bottom portion of the inner tube to said wafer or wafers positioned as above, thereby essentially impeding inflow of said reaction gas into the inner tube.

In accordance with another object of the present invention there is provided an apparatus for producing a semiconductor device, comprising:

a vertical reaction tube comprising an inner tube and an outer tube, which tubes form therebetween an annular channel communicating with a tubular space of the inner tube;

an exhaust port formed through the bottom portion of said outer tube;

a port for introducing a reaction gas, formed through a portion of said outer tube at a level substantially the same as or above a top end of the inner tube;

a port for introducing an inert gas, formed through the bottom portion of the inner tube; and, a wafer holder for holding a wafer or wafers, capable of being vertically displaced in the inner tube, until the wafer or wafers are lifted up to a level substantially the same as or above the top end of the inner tube;

further comprising:

a passage of the inert gas formed between the inert-gas port and the holding position of wafer or wafers and within the inner wall of the inner tube, which passage essentially impedes inflow of the reaction gas into the inner tube; and, a pedestal of the wafer holder, abutting gas-tight with the bottom of said heating furnace, when the wafer or wafers are lifted up to the level substantially the same as or above the top end of the inner tube.

According to the method and apparatus of the present invention, the gas flow, which includes the reaction product, shifts away from the vicinity of the top end of the inner tube toward the annular channel between the inner and outer tubes. Since the reaction gas is brought into contact with a wafer(s) and then caused to flow into the channel for withdrawing the reaction gas, the drawbacks of particles formed are lessened. In order to fully attain such an effect, the inert gas preferably has a higher pressure than the reaction gas. In addition to the effect of the inert gas as described above, it impedes deposition of the reaction product on the inner wall of the inner tube, in a case where a small amount of the reaction product intrudes into the tubular space of the inner tube.

The wafer(s) is preferably lifted above the level of the top end of the inner tube and located within the inner space of the outer tube, when the wafer is caused to react with the reaction gas. Also in this case, the inert gas impedes inflow of the reaction gas into the inner tube. The inert gas may have a slightly lower pressure than that of the reaction gas.

The method and apparatus according to the present invention attain (a) uniform heating of a wafer(s) and (b) such a small number and size of particles as to not interfere with producing an integrated circuit with an integration degree of 64M or more. The requirement (b) is fulfilled by generating as few particles as possible particles within the inner tube through which the wafer(s) is inserted and withdrawn.

The passage of inert gas mentioned above can be formed by, for example, the outer circumferential wall of a wafer holder and the inner wall of the inner tube. The so formed passage is in the form of an annular channel. The passage of inert gas can also be formed by any means capable of forming an annular channel between the outer wall of such mean and the inner wall of the inner tube. Alternatively, the inner tube may be provided with a lug laterally protruding from a top portion of the inner tube, and the wafer holder may be provided a laterally protruding lug at such a position that the passage of inert gas is formed between the two lugs. The so formed passage can have an L shaped section.

An embodiment of the method according to the present invention, comprises the step of:

defining an annular space between the top inner surface of the inner tube and a means for forming said annular space, for example a wafer-holder, through which annular space said inert gas is caused to flow. The dimension of this annular space can be so adjusted that the inert gas can pass therethrough but the reaction gas virtually does not intrude thereinto.

Another embodiment comprises the steps of:

withdrawing the wafer(s) from the vertical reaction tube; and, subsequently, cleaning the inner space of said vertical reaction tube by means of a plasma.

The plasma may be generated by energizing rod-form electrodes, which extend in the axial direction of the vertical reaction tube at least above the position of the wafer(s), and, are permanently positioned between the heating furnace and the outer tube.

Since the reaction on the wafer(s) is deemed to occur in a single tube in the method according to the present invention, the plasma generated by the permanently installed electrodes can be concentrated on the inner wall of the outer tube. The reaction product deposited on the inner wall of outer tube can be effectively removed by the plasma. The cleaning effect can be enhanced by the present invention as compared with the known method, in which the inner wall of the inner tube must be cleaned. The influence of particles on a wafer can therefore be furthermore decreased by the present invention.

When the inner tube is cleaned after the heat treatment every 20 to 30 cycles, the particles on the inner wall of the outer tube can be removed. After the cleaning, particles which may have been generated during the heat treatment, become small in size and number. It is not necessary to disassemble the quartz tube at each cleaning. The cleaning operation is easy and the operating efficiency of the production apparatus is enhanced.

In the present invention, one wafer may be positioned horizontally. Alternatively, a plurality of wafers may be positioned horizontally. In this case, the reaction gas is introduced from a side portion of the outer tube and withdrawn from the opposite side portion of the outer tube.

Yet another embodiment of the present invention comprises, prior to the step of feeding the inert gas from the bottom portion of the inner tube and the step of vertically displacing the wafer(s), the step of elevating the temperature of the heating furnace to a reaction temperature. According to this embodiment, the heating furnace is preliminarily heated to a temperature appropriate for the intended reaction. The wafer(s) is then lifted into a region having such temperature. The heating time of the wafer(s) can therefore be shortened, and thermal budget can thus be lessened.

Still another embodiment further comprises heating the wafer(s) to a preliminary heating temperature lower than the reaction temperature. This preliminary heating can be carried out by a preliminary heating furnace which is located below and concentrical to said heating furnace, between which furnaces an adiabatic plate is sandwiched. Moisture on the wafer(s) can be removed by the preliminary heating.

The wafer(s) may be rotated during the reaction, so as to enhance the thickness uniformity of the film formed on a large-diameter wafer. The thickness uniformity can be considerably enhanced, specifically within ±1%.

The "heat treatment" herein includes: a diffusion and formation of oxide film under normal pressure; formation of silicide films, such as $WSi_2$ and $TiSi_2$, by a reduced pressure CVD; reduced pressure CVD; growth of non-doped or doped silicon by using $SiH_4$ and $Si_2H_6$ as the reaction gas; formation of HTO (High Temperature Oxide Film); formation of $SiO_2$ film using TEOS as the starting gas; formation of an extremely thin capacitor; and, formation of ferroelectrics or dielectric material having a high dielectric constant (BST, STO or $Ta_2O_5$) by CVD.

BRIEF DESCRIPTION OF DRAWINGS

FIG. 12 shows the wafer holder used in FIG. 11.

DESCRIPTION OF PREFERRED EMBODIMENTS

Figure 1:
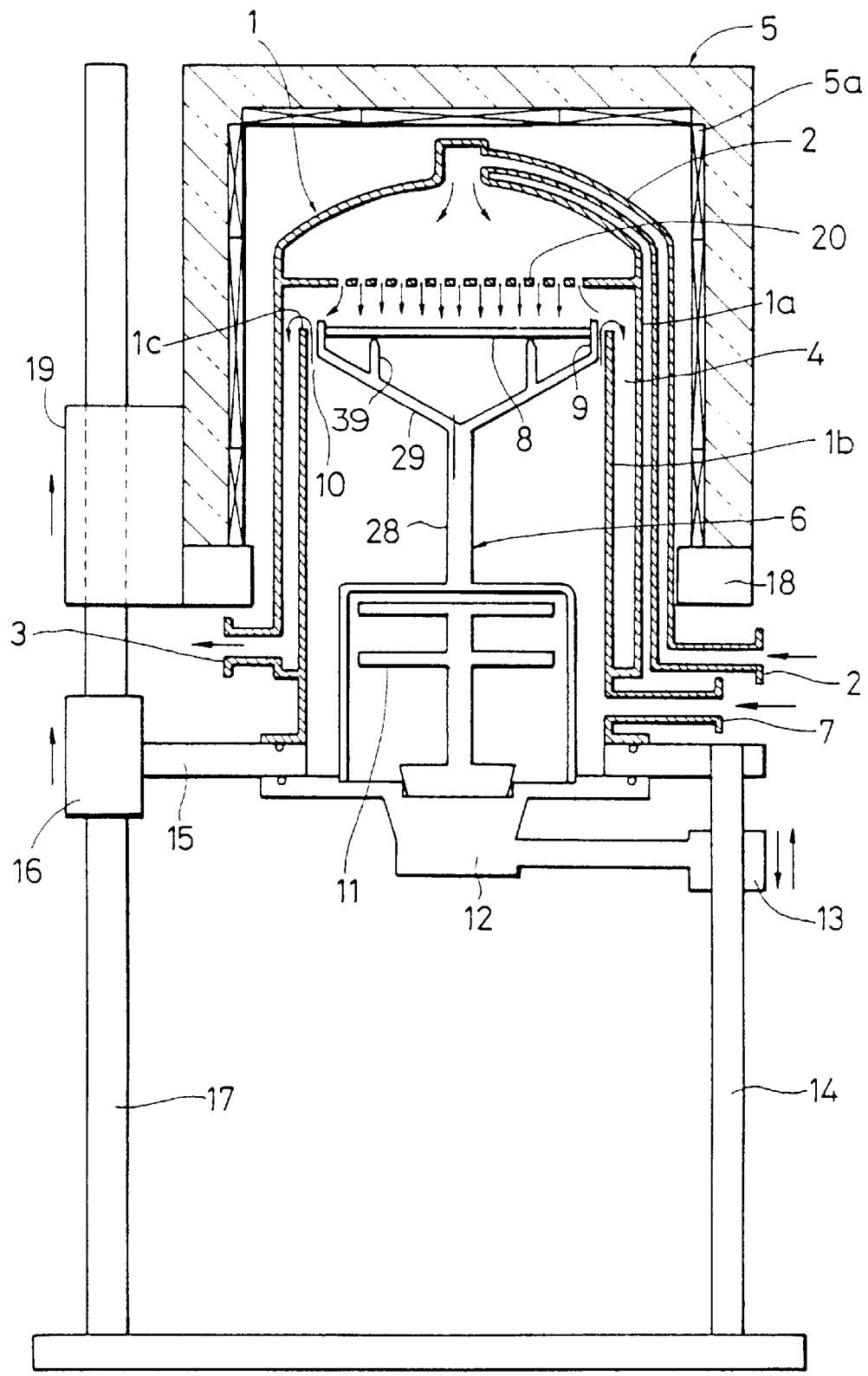
FIG. 1 shows an example of the method and apparatus for producing a semiconductor device and illustrates particularly that a wafer is held at a level substantially the same as the top end of the inner tube.

Referring to FIG. 1, an embodiment of the method and apparatus according to the present invention is illustrated. The members, such as the dual reaction-tube 1, the inner tube 1b, the outer tube 1a, the inlet conduit for the reaction gas 2, the exhaust tube 3, the annular channel 4, the heating furnace 5, the wafer holder 6, the wafer 8, the shielding plate 11 and the pedestal 12 are known and correspond to those shown in FIG. 17. The inlet conduit of the reaction gas 2 is connected to the inlet port formed at the top of the outer tube 1a. The inner tube 1b and the outer tube 1a are aligned concentrically and the annular channel 4 is formed therebetween. The inlet conduit of the inert gas 7 is connected to the inlet port of the inert gas, formed at the bottom of the inner tube 1b.

The heating furnace 5 is rigidly mounted on the furnace base 18, which is in turn rigidly secured to the furnace-lifter 19. The furnace lifter 19 is provided therein with a motor and a gear which is engaged with the guiding rod 17. When the motor is energized, the heating furnace 5 is lifted or lowered and can be adjusted to the position shown in FIG. 1. The dual-tube reactor 1 is stationarily held at the position shown in FIG. 1 by means of the holder 16 and the guiding rod 17.

The lifter 13 is engaged with the guiding rod 14 and sets the wafer 8 at the position shown in FIG. 1. That is, the lifter 13 is guided along the guiding rod 14, when the vertical position of the wafer 8 is to be adjusted in the inner tube 1b.

The entire apparatus shown in FIG. 1 is located in a container, in which for example nitrogen is filled. The heating furnace 5 preliminarily sets a reaction temperature therein by means of energizing the resistance heater or lamp 5. The wafer 8 is then gradually lifted, while evacuating the furnace interior to attain a certain reduced pressure if necessary.

Figure 17:
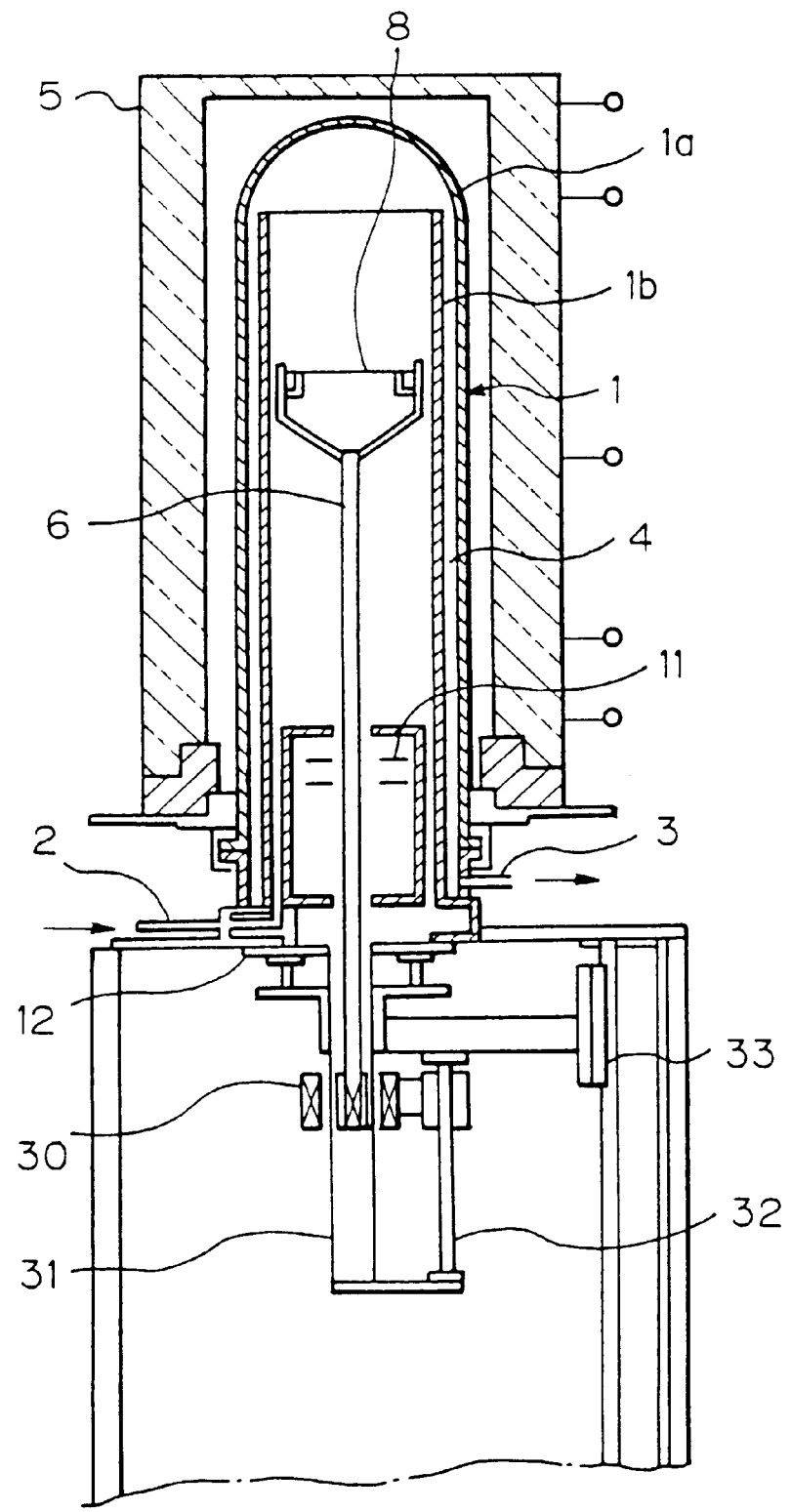
FIG. 17 illustrates the conventional method and apparatus for producing a semiconductor device.

The wafer 8 can be rotated by using the mechanisms 30, 31 and 32 shown in FIG. 17.

A few arms 29 are branched from the top end of the shaft 28 aslant and upward, and a holding rod 39 protrudes vertically upward from an intermediate portion of each arm 29. The single wafer 8 is supported by the holding rods 39. Although the above described method for holding the wafer 8 attains a high-speed and uniform heating characteristic of the wafer holder 6, the top ends of the holding rods 39 are convergently shaped in order to lessen absorption of the wafer's heat and hence to furthermore enhance the uniform heating characteristic. The periphery of the wafer 8 is of a round shape with a local facet or notch. The top portions of the arms 29 extend vertically upward and support the ring body 9 which has a continuously circular shape. The periphery of wafer 8 faces the inner surface of the ring body 9 with as small a clearance as possible but which enables setting and withdrawal of the wafer 8 before and after the heat treatment, respectively. Meanwhile, the outer surface of the ring body 9 faces the inner surface of the inner tube 1b via the annular clearance 10 which is continuous and has a constant width. The inert gas from the inlet conduit 7 upward flows through the annular clearance 10 as defined above.

Figure 2:
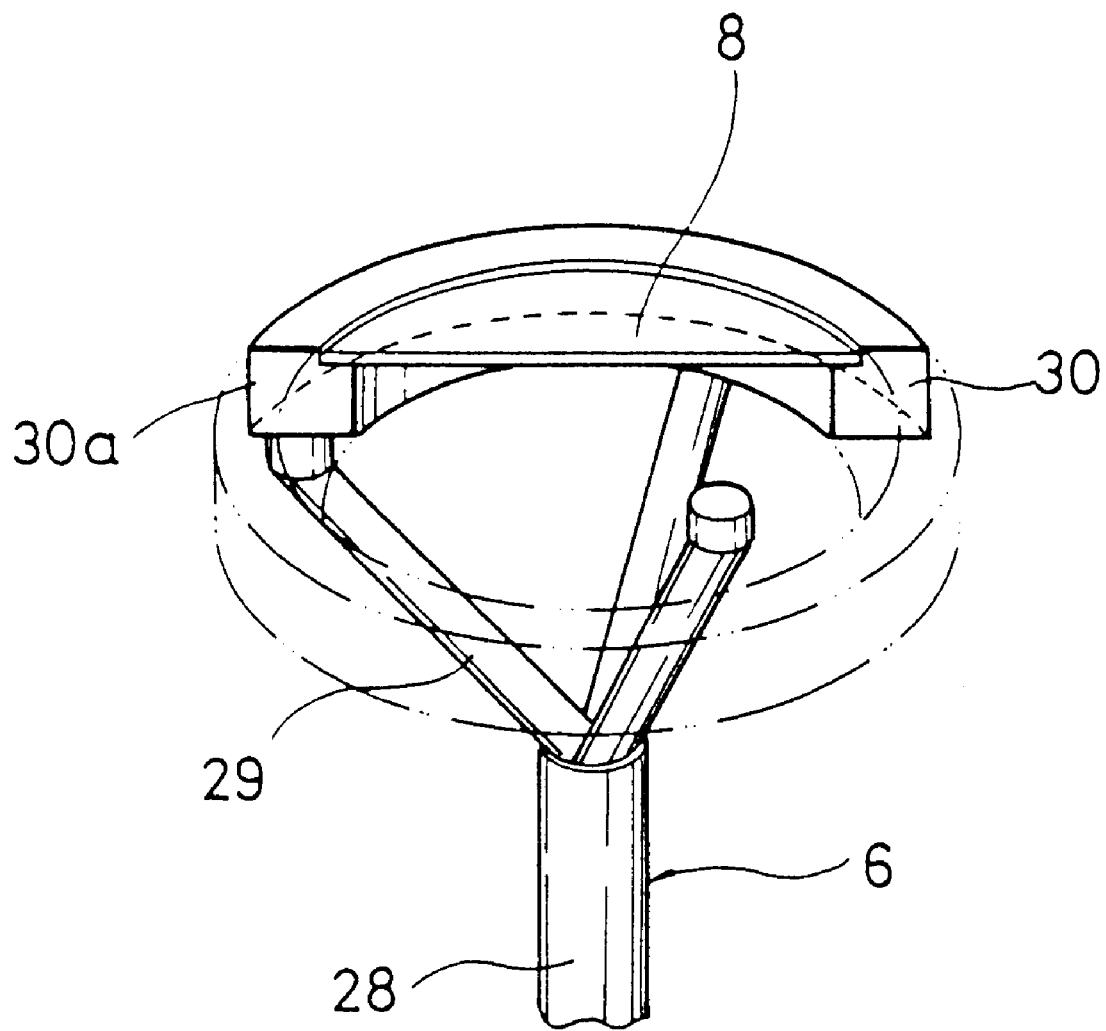
FIG. 2 shows an example of a wafer holder.

Referring to FIG. 2, another embodiment of the wafer holder is illustrated. Three arms 29 protrude aslant and upward from the top end of the shaft 28, and the annular base 30 is rigidly secured on the top end of the arms 29. The annular base 30 has an L shaped cross section. The periphery of the wafer 8 is placed on the L shaped portion of the annular base 30. The outer peripheral surface 30a of the annular base 30 faces the inner wall of the inner tube 1b, so that the annular clearance 10 (FIG. 1) is defined between 30a and 1b. Although the wafer 8 has a circular shape in FIG. 2, its shape may be rectangular or square. An inner tube having a square cross section is usually used for heat treating a square wafer. An outer tube having a round cross section is usually used in combination with the inner tube having a square cross section.

Referring again to FIG. 1, a baffle plate 20 is located above the wafer 8 and is perforated with a number of holes formed through the entire surface except for the periphery, so as to supply the reaction gas uniformly over the wafer surface. If necessary, the wafer holder 6 is rotated so as to furthermore enhance the uniformity of the heat treatment. The dual reaction-tube 1 may be under reduced pressure or normal pressure. The exhausting conduit 3 may be communicated with a pump, if necessary.

One of the most characterizing features of the method and apparatus illustrated in FIG. 1 resides in the points that: the pedestal 12 abuts on the bottom of the dual-tube reactor 1; the wafer 8, whose upper surface is brought into contact with the reaction gas to form a film or the like, has been displaced to a level higher than the top end 1c of the inner tube 1b prior to the initiation of reaction; an annular clearance 10, which is considerably narrower than the space above the wafer 8, is thus formed; and, further the inert gas flowing through the annular clearance 10 impedes the inflow of reaction gas into the inner tube 1b. Incidentally, the pedestal 12 may be integral with the wafer holder 6 or may have a structure as shown in FIG. 17. The size of annular clearance 10 is usually approximately 2 mm.

The reaction is completed at the position of the wafer as shown in FIG. 1. Then, the inflow of the reaction gas from the inlet conduit 2 is stopped, and, the wafer 8 is withdrawn from the reactor. On the inner wall of an inner tube 1b, into and from which a wafer(s) is inserted and then withdrawn, the reaction product does not accumulate as described earlier. The wafer(s) is therefore prevented from contamination with particles during the wafer's insertion and withdrawal.

The method and apparatus illustrated in FIG. 1 treat a single wafer 8 and is pertinent for a high-speed growth. In the case of growth of poly silicon by CVD, a growth rate as high as 3000 to 10000 angstroms per minute can be attained. In addition, since the gas flow is adjusted by the baffle plate 20, the uniformity of film thickness attained is within approximately 1% in the case of a 6-inch wafer. The high-speed growth and the film-thickness uniformity are therefore compatible in the present invention. Incidentally, in the conventional batch treatment, the growth rate is approximately from 80 to 800 angstroms per minute.

According to another embodiment of the method and apparatus illustrated in FIG. 3, the baffle plate 32 is located directly below the outlet port 2a which is formed at the front end of the inlet conduit of the reaction gas 2. The baffle plate 32 is a round disc as shown in FIG. 4 and is fixed to the outer tube 1b by four rods 32a. The baffle plate 32 impedes the flow of the reaction gas directing vertically downward and makes the distribution of reaction gas over the wafer surface uniform.

Since the position of a wafer(s) in the inventive method is higher than in the conventional method illustrated in FIG. 17, the baffle plate 32 for guiding the flow of the reaction gas is more effective in enhancing the reaction uniformity on the wafer surface than in the conventional method. When the reaction gas is guided by a baffle plate in the conventional method, the gas flow is somewhat disturbed during its flow within the inner tube onto the wafer surface. The baffle plate is therefore not very effective in the conventional method.

Figure 3:
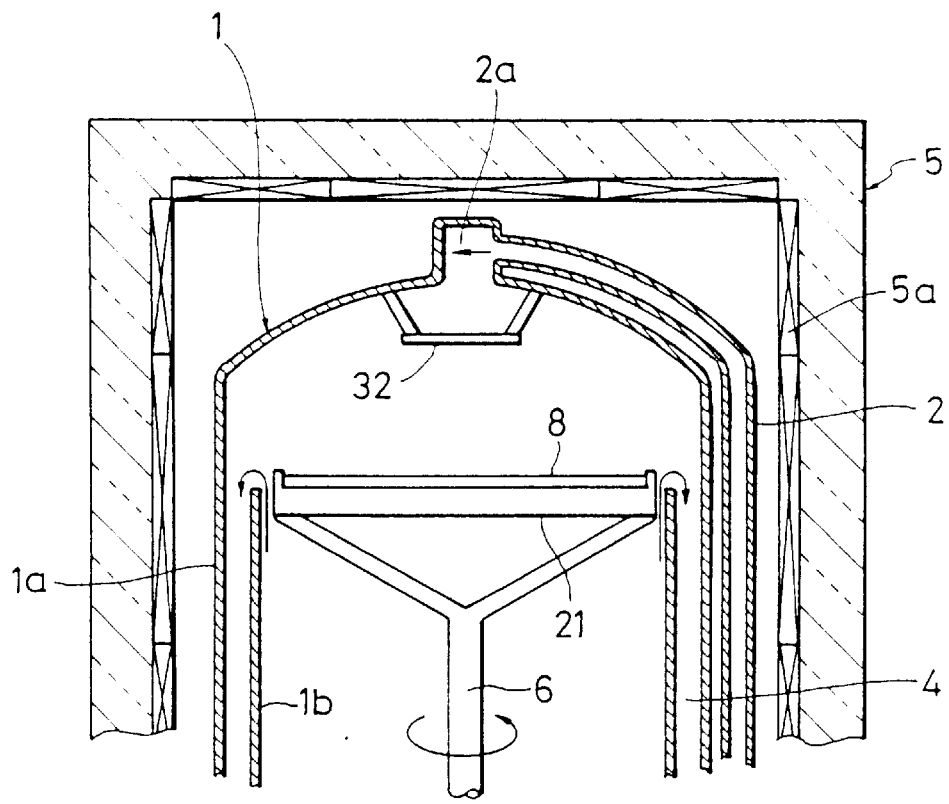
FIG. 3 shows an example of the method and apparatus for producing a semiconductor device and illustrates particularly that a wafer is held at a level substantially the same as the top end of the inner tube and that a baffle plate is used to guide the gas flow.
Figure 4:
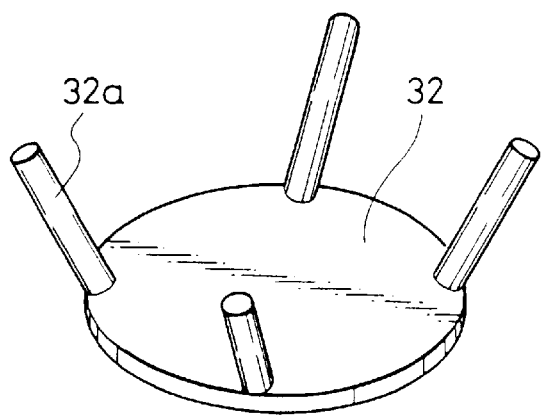
FIG. 4 is an elevational view of the baffle plate.

Referring to FIG. 3, the wafer 8 is placed on the separator 21 which is in the form of a round disc. Since the entire under side of the wafer 8 is supported by the separator 21, no reaction occurs on the under side. This method is advantageously applied in the CVD method, in which a gate film made of $SiO_2$ or SiON is grown to a thickness of up to 70 angstroms or less, and further, an extremely thin film is formed due to the reaction of bulk Si, such as in the case of forming a gate film of a flash memory. The reaction of bulk silicon can be carried out, for example, as follows. The bulk silicon is oxidized at 1100° C. for 30 seconds using $N_2O$ as the reaction gas, so as to form an $SiO_2$ film. Alternatively, the bulk silicon is nitrified at 950° C. for 40 seconds using $NH_3$ as the reaction gas so as to form an SiON film. Such oxidation and nitrification of bulk silicon are carried out under normal pressure. The flow rate of oxygen or $NH_3$ can be approximately 5 liters per minute in the case of an 8-inch wafer.

Due to the effects of the baffle plate 32 in guiding the gas flow, the thickness distribution of an $SiO_2$ film and an SiON film on an 8-inch wafer is excellent, specifically within ±1%. When the wafer holder 6 is rotated at approximately 10 rpm, thickness distribution on a large-diameter wafer is furthermore improved.

Although a horizontally placed single wafer 8 is described with reference to FIG. 3, vertically placed wafers may be subjected to the heat treatment. The wafer holder shown in FIG. 2 may be used in the apparatus shown in FIG. 3.

Figure 5:
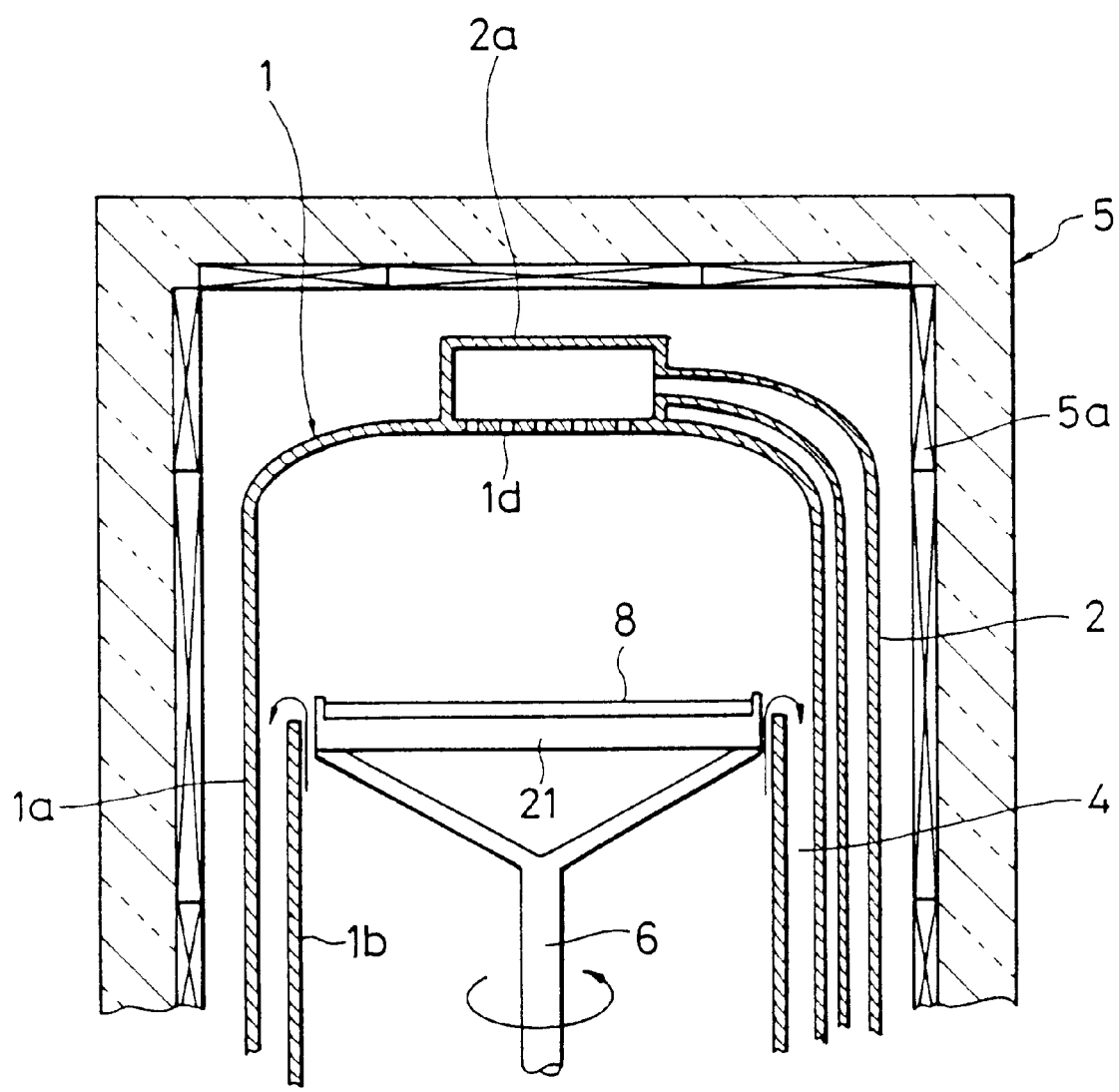
FIG. 5 shows an example of the method and apparatus according to the present invention and illustrates that the wafer is held at a level substantially the same as the top end of an inner tube and the outer tube is provided with, at its outlet, a port to guied the flow of reaction gas.

Referring to an embodiment illustrated in FIG. 5, apertures 1d are formed in the central top of the outer tube 1a, so as to decrease the difference in the flow speed of gas flowing along the inner wall of the outer tube 1a and the center of the outer tube 1a. The distribution of reaction gas on the wafer surface can therefore be made uniform.

Figure 6:
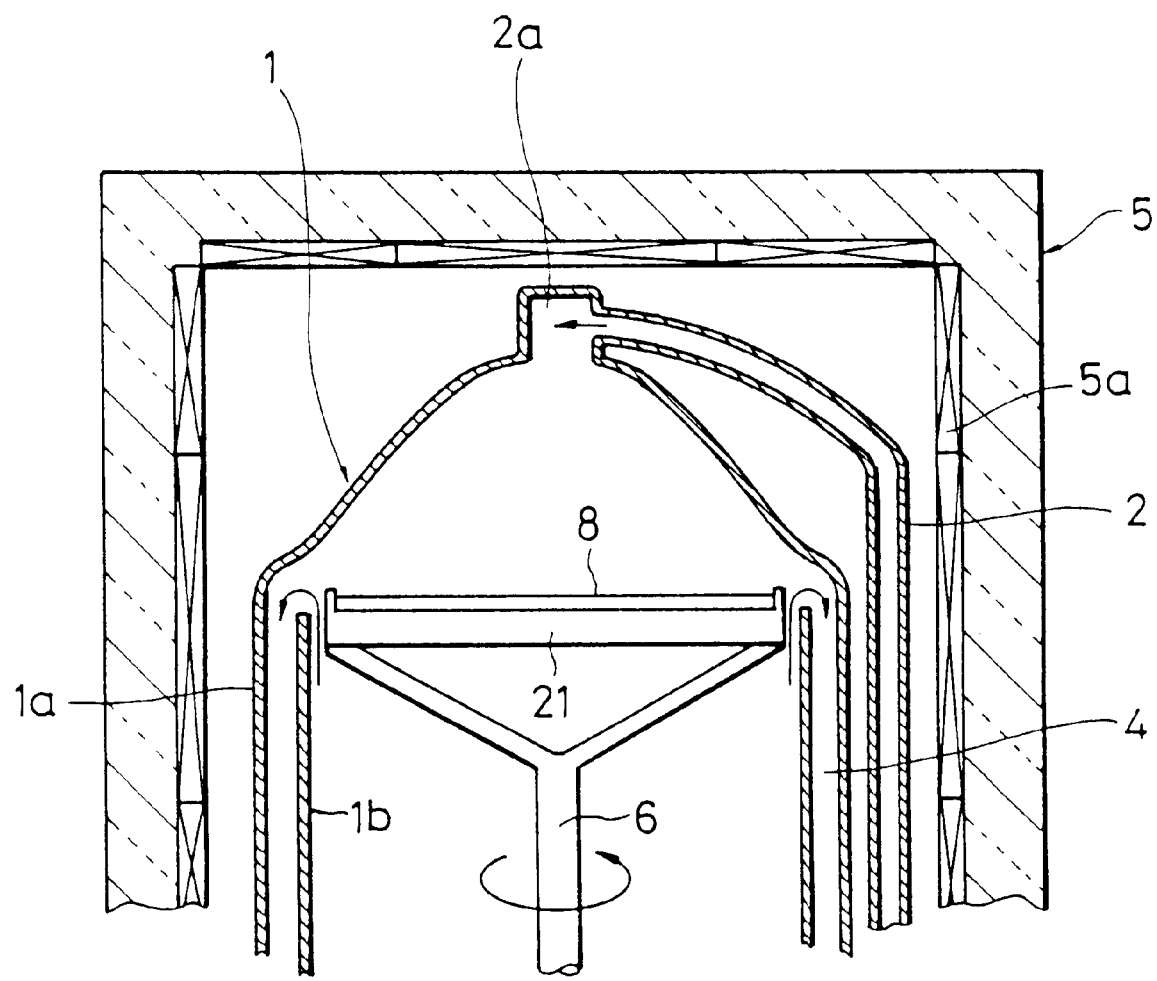
FIG. 6 shows an example of the method and apparatus according to the present invention and illustrates that a wafer is held at substantially the same level as the top end of inner tube, and, further the shape of outer tube is modified to adjust the flow or reaction gas.

Referring to an embodiment illustrated in FIG. 6, the shape of the outer tube's upper portion above the wafer 8 is modified so as to make the distribution of reaction gas on the wafer surface uniform.

Figure 7:
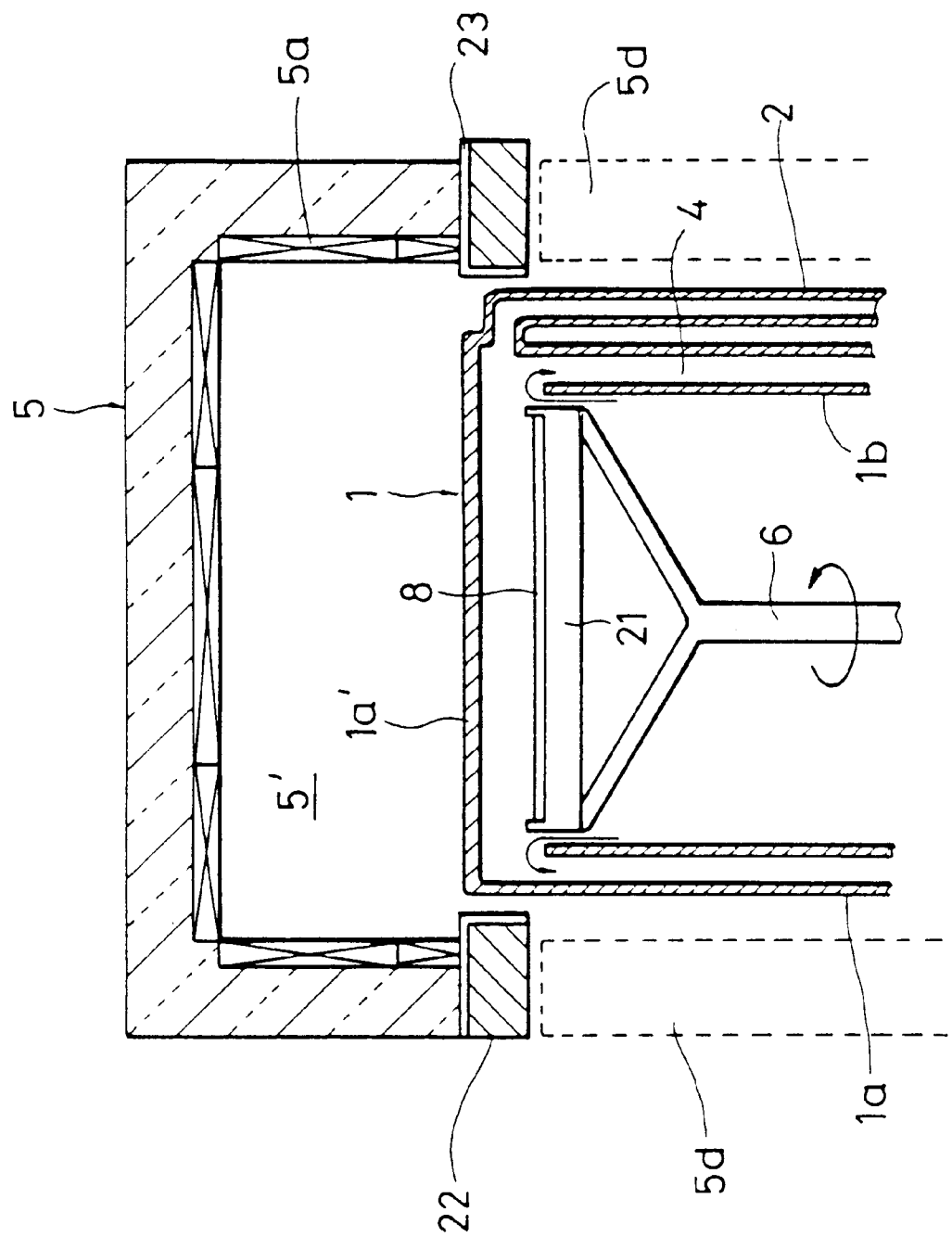
FIG. 7 shows an example of the method and apparatus according to the present invention and illustrates that a reflecting gold-plating is provided at a level substantially the same as the top end of the inner tube.

Referring to an embodiment illustrated in FIG. 7, the heating furnace is a hot-wall type. The heater 5a is therefore an electrical resistance heater. The gold plating 23 is provided in the bottom of the hot-wall type furnace 5. The gold plating 23 has a function similar to a lamp and can make the temperature distribution and hence the reaction occurring on the wafer surface uniform. The outer tube 1a has a flat top portion 1a'. The inlet conduit 2 of the reaction gas is opened beside the flat top portion 1a'. In the case of evacuated pressure CVD, the flat top portion 1a' should be so thick as to prevent it from collapsing due to atmospheric pressure.

The water-cooled jacket 22 is fixed to the bottom of the heating furnace 5 provided with the electrical resistance heater 5a. The gold plating 23 is attached on the surface of water-cooled jacket 22 facing the furnace interior 5'. Preferably, the preliminary heating furnace 5d is provided below and in contact with the water cooled jacket 22. When moisture on the wafer surface exerts detrimental influence, it is advisable to provide the preliminary heating furnace 5d.

The electrical resistance heater 5a emits radiant light having various wave lengths. The radiant light from the heater 5a is reflected from the gold plating 23 and is applied on the wafer 8 to heat it. The temperature uniformity of the wafer 8 is more uniform than in the case where the heater 5a is a lamp. Since the reflective ring consisting of 22 and 23 is cooled in its interior, the temperature of the reflective ring 22, 23 does not rise. This is the same as in the case of lamp heating. However, since the wave length of radiant heat from the electrical resistance heater 5a is various, there is a certain wave length capable of being absorbed by a film deposited on the wafer. In other words, since the material of a film has a selectivity of wave length of light absorbed, when the light from the heating source is of a monotonous wave length, strain may be induced in a film heated by such heating source, as in the case of lamp heating.

The method illustrated in FIG. 7 is appropriate for a CVD under pressure of from approximately 500 Torr to normal pressure. For example, the growth of $SiO_2$ is carried out at a temperature of from 360 to 400° C. using TEOS and $O_3$ as the reaction gas by means of the apparatus shown in FIG. 7. The reaction using the reaction gas involves a surface reaction. The wafer is situated at the highest temperature region and is heated under the two mechanisms described above, i.e., radiant heating from the electrical resistance heater 5a and radiant heating from the gold plating 23. The reaction mentioned above proceeds at a high rate. When the reaction is carried out under the conditions described above and at from 4 to 5% of $O_3$ concentration, the growth rate attained is from 3000 to 6000 angstroms per minute. A large-diameter wafer is preferably rotated at 5 to 20 rpm. Since $O_3$ decomposes at 360° C. or lower, the above described condition is effective for preventing the decomposition of $O_3$ from occurring and maintaining the $O_3$ concentration at a high level.

In the method illustrated in FIG. 7, the heat-shielding plate (not shown) may be used to shield the open bottom of the heating furnace, until the temperature in the heating furnace 5 attains the predetermined temperature. Upon attainment of the predetermined temperature, the dual reaction tube is advanced into the furnace interior 5'. Rapid heating can thus be realized.

Figure 8:
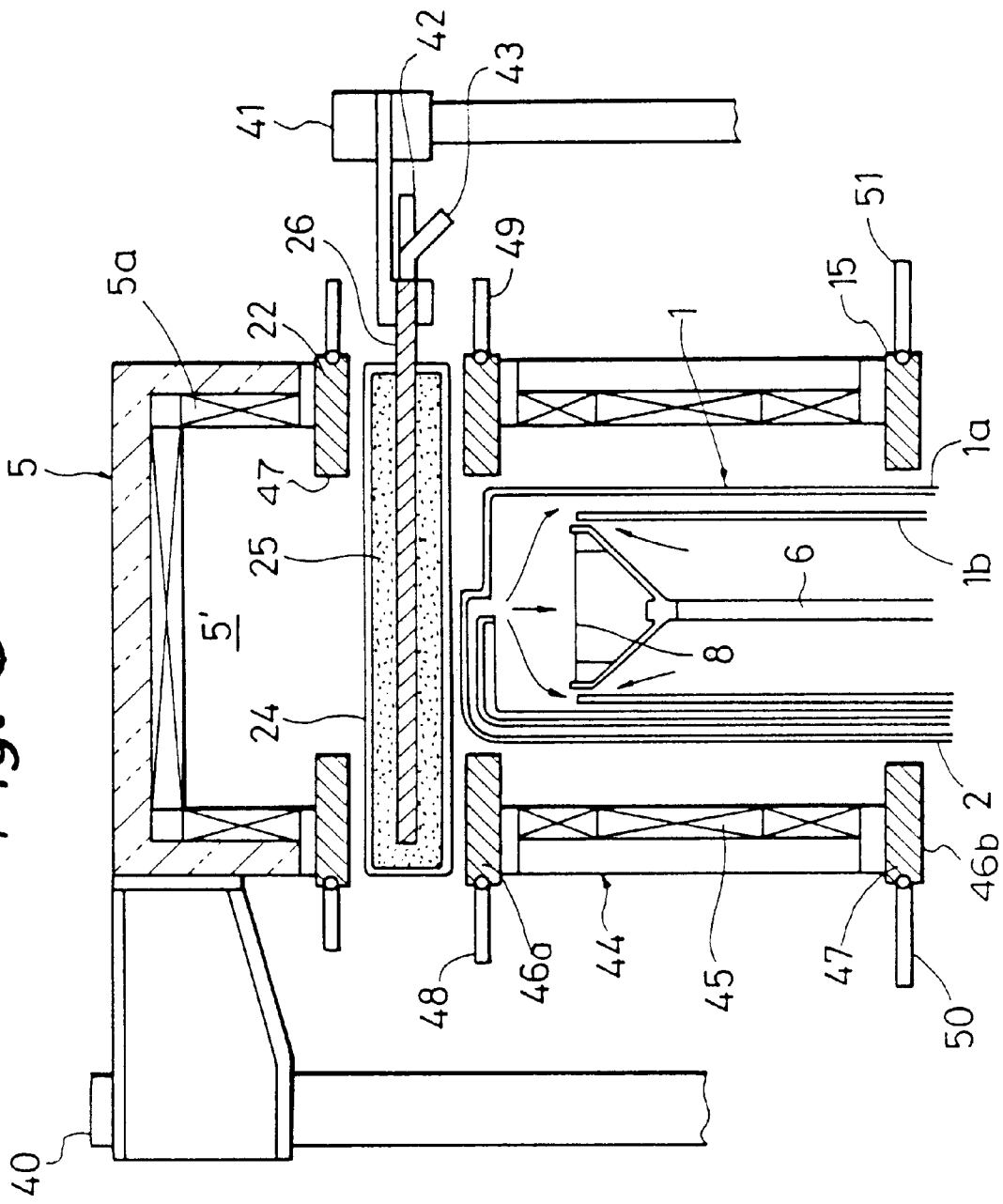
FIG. 8 shows an example of the method and apparatus according to the present invention and illustrates the heating furnace comprising an upper furnace, and a lower furnace which is used as a preliminary heating furnace. The bottom of the upper furnace is opened when its temperature is elevated. The top of the lower furnace is closed, when the temperature of the dual tube reactor is elevated to the preliminary temperature.

The apparatus shown in FIG. 8 is an improved version compared with the apparatus shown in FIG. 7.

The upper heating-furnace 5 is lifted by the shaft 40 directly above the lower heating furnace 44. The water-cooled jacket 26 is cooled by cooling water which is supplied via the inlet 42 and withdrawn from the outlet 43. The water-cooled jacket 26 is covered by gold plating, both of whose surfaces are covered by the adiabatic layer 25 which is in turn covered by the quartz coating 24. The water-cooled jacket 26 is swiveled by the shaft 41 to close the open bottom of the upper heating furnace 5. The temperature of the furnace interior 5' is then elevated, while the heat emission from the furnace interior 5' is shielded by the members 24, 25 and 26.

The dual-tube reactor 1 is preliminarily heated by the preliminary heating furnace 44 to a temperature of from 150 to 200° C. for the purpose of removing the moisture on the wafer surface. When the wafer temperature reaches a preliminary heating temperature high enough to remove the moisture, and the preliminary heating is thus completed, the water-cooled jacket 25 is excluded from a space between the two furnaces 5 and 44 by means of swiveling the shaft 41. The upper furnace 5 is then lowered by means of driving the shaft 40, so that the reflective rings 46a and 47 are brought into close contact with one another. Since the upper heating-furnace 5 is preliminarily heated to a reaction temperature, the reaction gas is supplied into the dual-tube reactor 1 so as to initiate the reaction. The reference numerals 48 and 50 indicate inlets for cooling water. The reference numerals 49 and 51 indicate outlets for cooling water.

According to the method described with reference to FIG. 8, the rate of temperature-elevation up to the reaction temperature is high. In addition, when the reaction gas is caused to flow directly before elevating the dual-tube reactor, the amount of particles generated can be further decreased.

Figure 9:
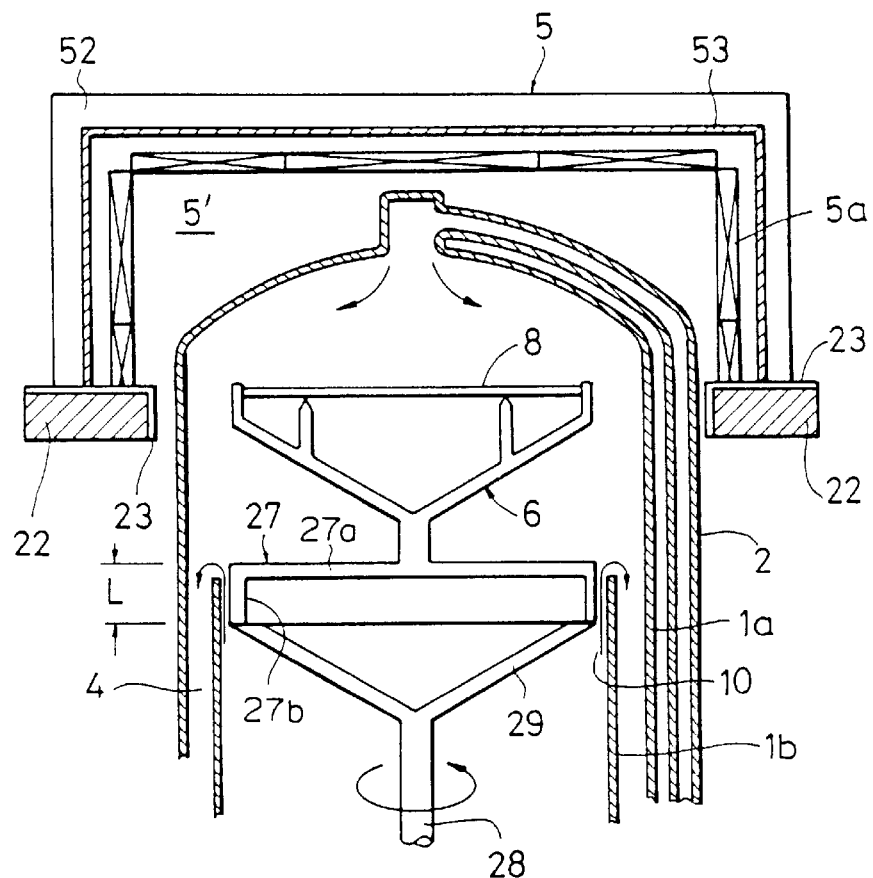
FIG. 9 shows an example of the method and apparatus according to the present invention and illustrates that a wafer is held at a level higher than the top end of the inner tube.
Figure 10:
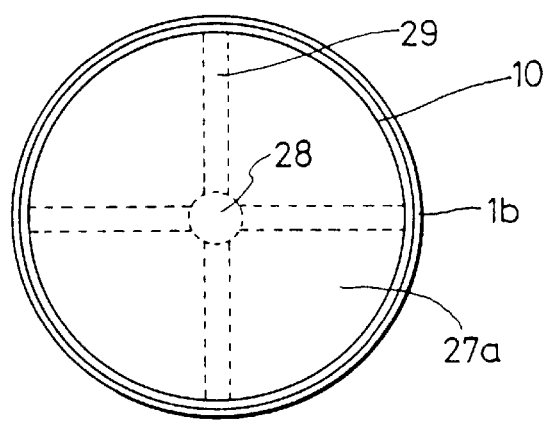
FIG. 10 is a plan view of a means for defining a channel of the inert-gas flow.

Referring to FIGS. 9 and 10, another example of the means for defining an annular clearance is illustrated. In this example, the annular clearance is defined by a means different from the space between the inner tube and the wafer holder. A disc 27a, which has essentially the same cross sectional area and shape as the wafer 8, is integral with the wafer holder 6. The disc 27a and the tubular portion 27b form a monolithic member 27. The tubular portion 27b is rigidly secured to the shaft 28 via the arms 29. The annular channel 10 is defined between the tubular portion 27b and the inner wall of the inner tube 1b. The monolithic member 27 is hereinafter referred to as a means 27 for forming an annular clearance.

The heating furnace 5 comprises a water-cooled jacket 52 which is lined with the gold plating 53. The electrical resistance heater 5a is fixed to the water-cooled jacket 52. This furnace structure shown in FIG. 9 can also be applied to the apparatus shown in FIG. 7.

The wafer 8 being heat treated is situated at the same height as the gold plated 23 water-cooled jacket 22. Temperature distribution in the furnace interior 5' becomes therefore very uniform due to the light reflection from the gold platings 23 and 53. The methods for guiding the reaction gas as shown in FIGS. 3 through 6 may be applied if necessary to the heat treatment as illustrated in FIG. 9. The tubular portion 27b should have a length (L) as great as possible for the purpose of impeding the mixing of the reaction gas with the inert gas.

In the method illustrated in FIG. 9, the wafer 8 is subjected to a reaction with the reaction gas flowing upward. The film grows therefore on the under side of the wafer 8. This method is pertinent to an evacuated CVD, in which an $SiO_2$ film is grown at a temperature of form 680 to 700° C. using TEOS and $O_2$ as the reaction gases. This method is also pertinent to the formation of HTO film using the $SiH_4$ or $Si_2H_6$ as the reaction gas or to the growth of amorphous Si film of a TFT device by the evacuated CVD with the use of $Si_2H_6$. This method is also pertinent to the production of LCD device.

Figure 11:
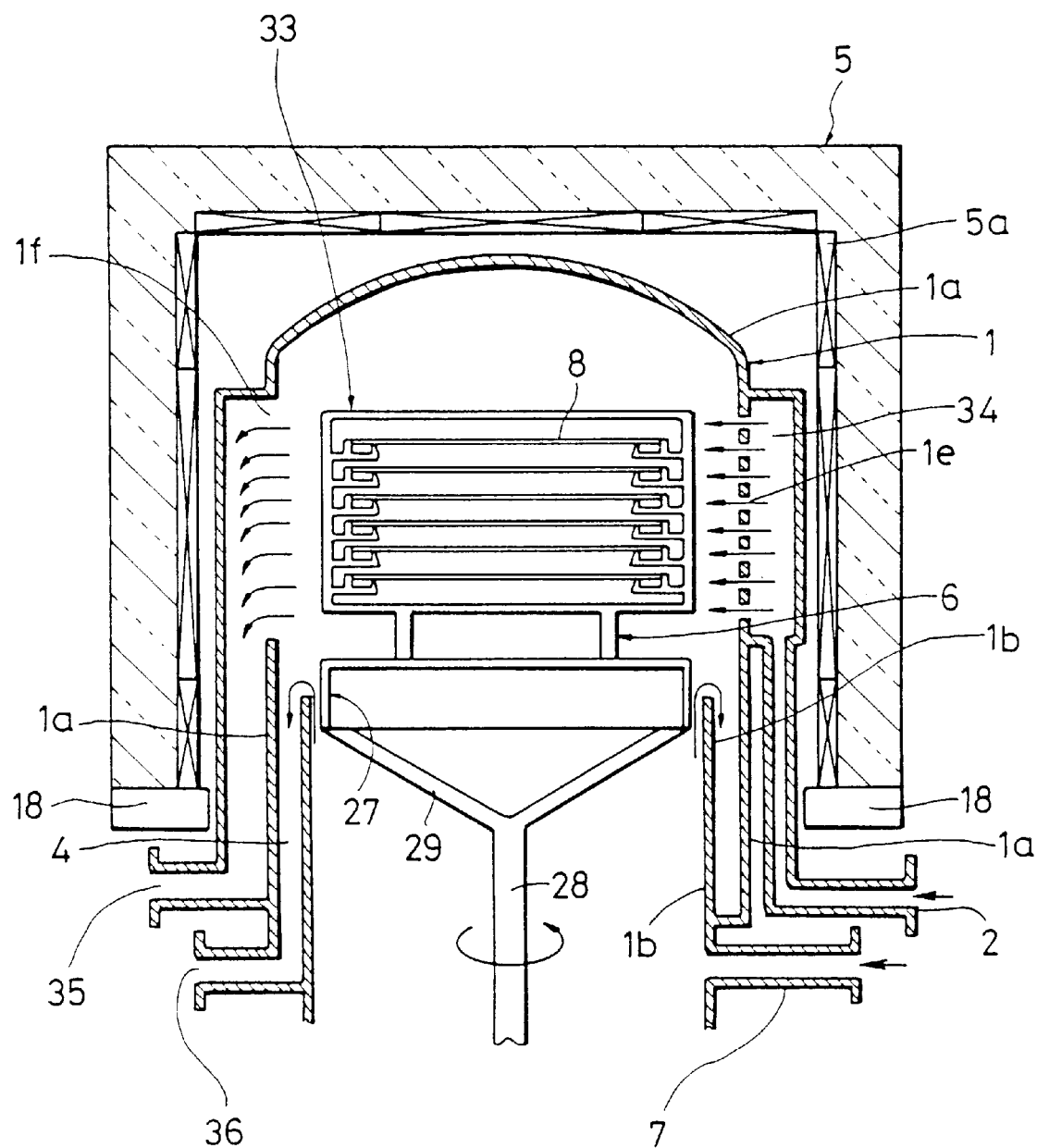
FIG. 11 shows an example of the method and apparatus according to the present invention and illustrates that a plurality of wafers are held horizontally at a level higher than the top end of the inner tube, and, further exhaust tubes for the inert gas and reaction gas are separately provided.

Referring to FIG. 11, is illustrated an embodiment of the method and apparatus of the present invention, in which a plurality of the wafers are hold at a level higher than the top end of the inner tube.

The reaction gas, which is supplied from the inlet conduit for the reaction gas 2, is redistributed in the reservoir of the reaction gas 34 which is formed around the upper vertical section of outer tube 1a and which has an arcuate shape with an angle of approximately 120° around the central axis of the outer tube 1a. The redistributed reaction gas flows through a number of blow-off apertures of the reaction gas 1e in a parallel direction toward the wafers 8 which are held horizontally by the wafer holder 33.

Six wafers 8 are held by the wafer holder 33, whose detailed structure is shown in FIG. 12. The rotatable shaft 6 is detachably inserted into the base 33a of the wafer holder 33. Three vertical rods 33b are branched from the base 33a. Horizontal rods 38 extend from the vertical rods 33b. The front ends of the horizontal rods 38 are connected by an arcuate member having an angle of approximately 270°. Three upward protrusions are formed on the arcuate member and the tip ends of the protrusions are shaped convergently so that the under side of each wafer 8 is supported by the three protrusions at their pointed front ends. Furthermore, upward protrusions 34 are formed on the horizontal rods 38 and their front ends are shaped convergently. These upward protrusions 34 prevent the wafers 8 from being laterally deviated. The convergent pointed end of the horizontal rods 38 provides a point contact with the periphery of the wafers 8.

The horizontally placed wafers 8 are brought into contact with the reaction gas which is blown over them at a thickness approximately the same as the total thickness of the wafers 8 as a whole. The reaction gas then flows into the exhausting conduit 35 which has a suction port approximately the same size as the height of the wafers 8 as a whole. The reaction of the surface of six wafers 8 therefore occurs very uniformly. This uniformity can furthermore be improved by means of rotating the shaft 28 and hence the wafers 8.

When a BPSG film is formed by using TEOS, TEOP, TMB or the like in a conventional vertical reactor, the reaction gas is concentrated or diluted in the upper and lower regions of the reactor. A dummy wafer, which cannot be used to produce a semiconductor wafer, is located in the reactor. The method and apparatus illustrated in FIG. 11 makes it unnecessary to use a dummy wafer. The method illustrated in FIG. 11 is also appropriate to use the growth of doped poly silicon.

Figure 13:
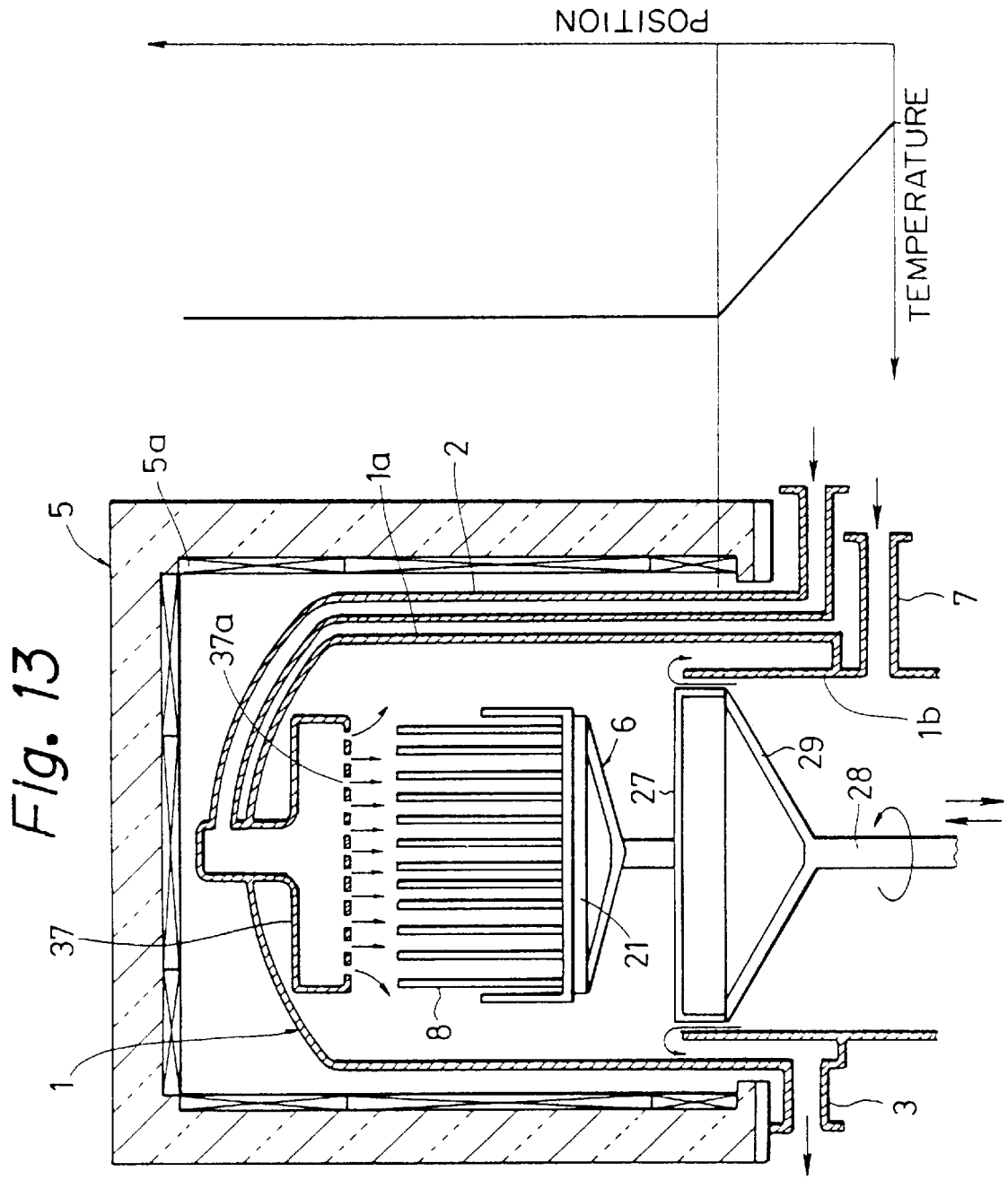
FIG. 13 shows an example of the method and apparatus according to the present invention and illustrates that a plurality of wafers are held vertically at a level higher than the top end of the inner tube, and, further how the means for defining the inert-gas channel is uniformly heated.

Referring to FIG. 13 an embodiment of the method and apparatus which is appropriate for forming a nitride film at for example 760° C. is illustrated.

A plurality of the wafers 8 are held vertically at a position higher than the top end of the inner wall 1b. The electrical resistance heater 5a uniformly heats the wafers 8 and even the means for forming an annular clearance 27. The blow-out device for the reaction gas 37 is located directly above the wafers 8. The reaction gas is therefore heated to a reaction temperature and is then guided to the wafers 8. The through holes 37a may be formed in a honeycomb shape and are separated from one another at a distance corresponding to the distance between the wafers 8. These through-holes 37a attain a desirable uniformity in batch treatment. The zone having a temperature uniformity is longer than the diameter of the wafers 8 and contributes to the uniformity of treatment.

The quality uniformity of a lot can be enhanced by means of changing the flowing method of gas in accordance with the method of placing the wafers as illustrated in FIGS. 11 and 13.

Figure 14:
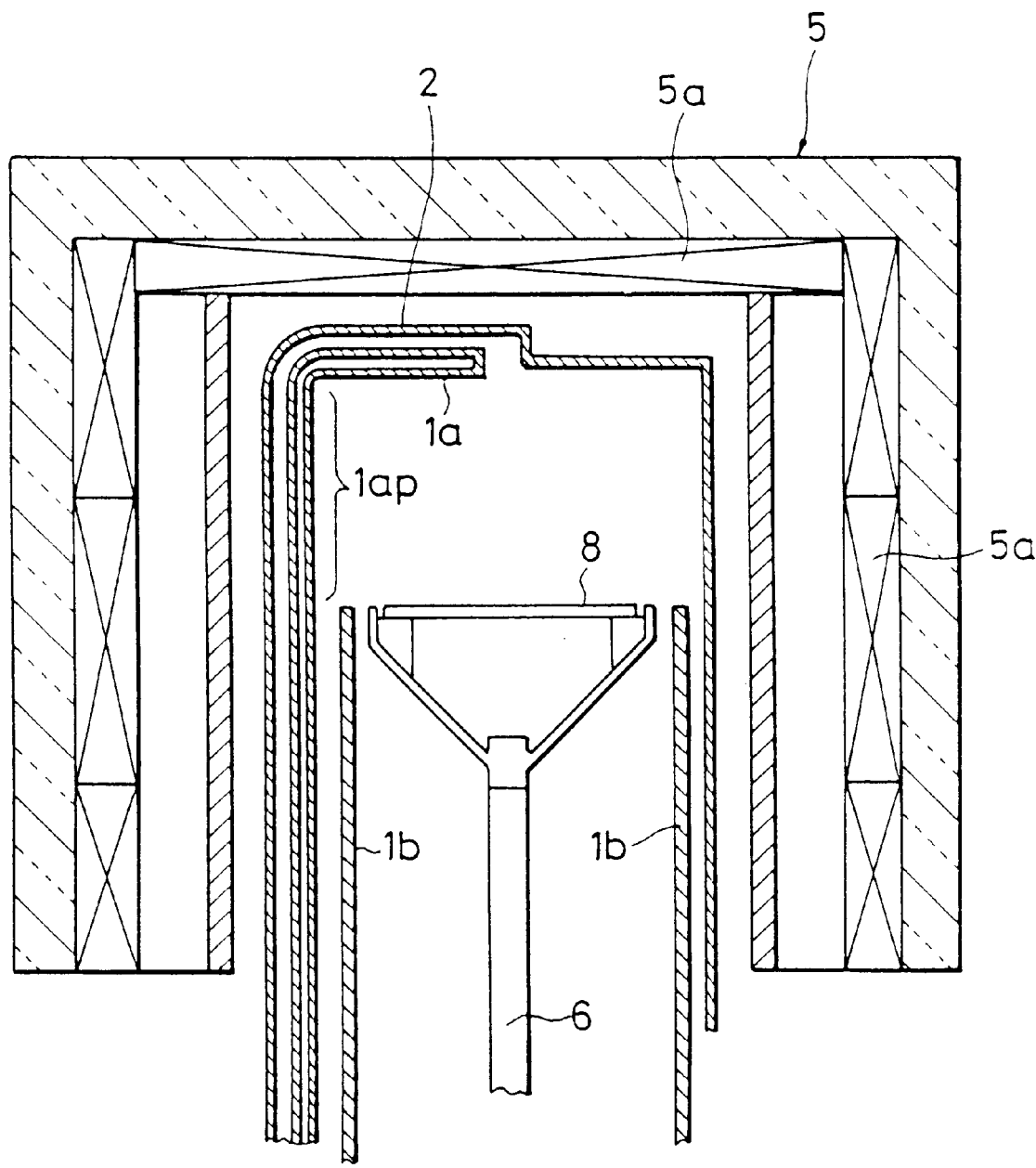
FIG. 14 illustrates the method and apparatus for cleaning the reactor tube's interior.
Figure 15:
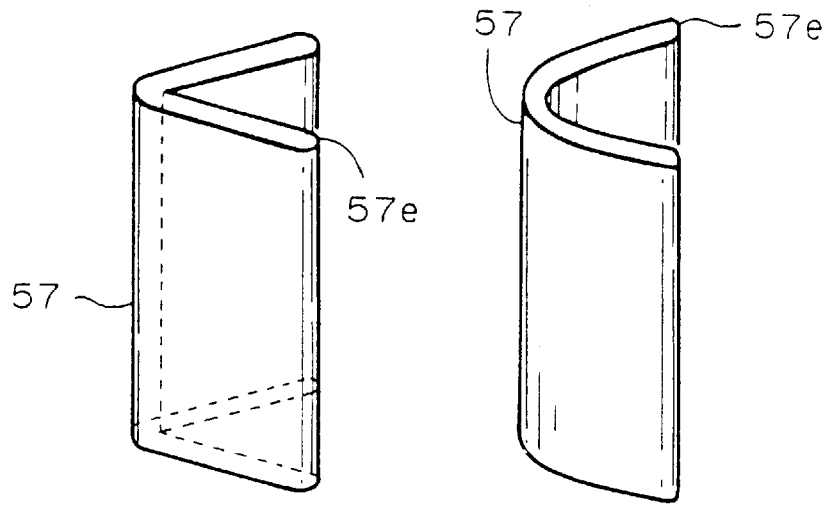
FIG. 15 shows the electrodes for cleaning.
Figure 16:
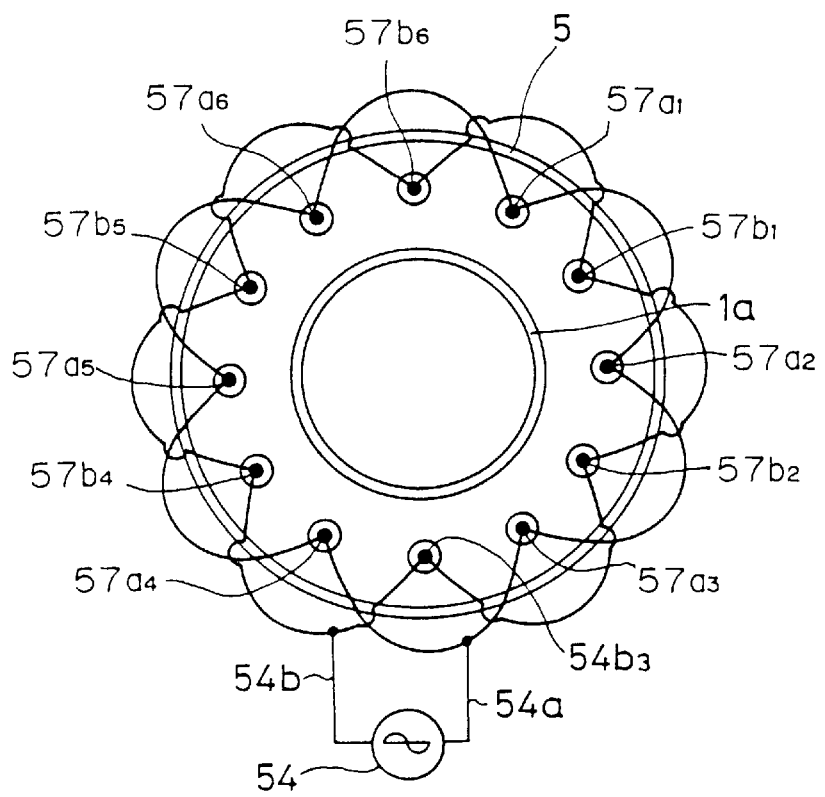
FIG. 16 illustrates a connecting method of electrodes.

FIG. 14 illustrates an example of the cleaning method of the present invention. The cleaning electrodes 57 extend in the axial direction of the furnace between the outer tube 1a and the heating furnace 5. The cleaning electrodes 57 may be provided at least in the zone lap above the inner tube 1b. However, in order to thoroughly clean the particles, the cleaning electrodes 55 are preferably as long as the heating furnace 5 and are preferably as close as possible to the quartz tube, i.e., the inner tube 1b. Since the cleaning electrodes 57 are permanently installed, the cleaning can be carried out simply and in a short period of time. The cleaning electrodes 57 may have any rod shape having a round, square, rectangular or irregular cross section and the like. Preferably, the cleaning electrodes 57 are made of a plate deflected in the round or trianglar shape as shown in FIG. 15. The side ends 57e of the cleaning electrodes 57 are brought into contact with or positioned close to the outer wall of the quartz inner tube 1b. The high-frequency current is concentrated on the inner wall of the inner tube 1b where the side ends 57e face.

Preferably, the high-frequency current source 54 is connected via the one pole 54a with the cleaning electrodes $57a_1-a_6$, while the other pole 54b is connected to the cleaning electrodes $57b_1-b_6$. The former and latter electrodes are connected in parallel. Gas used for generating plasma is $NF_3$, $SF_6$, $CF_4$ or the like. The inner pressure of the furnace is reduced to from 0.5 to 0.7 Torr. High frequency power of 13.65 MHz and 400 W is applied to the electrodes.

I claim:

1. A method for producing a semiconductor device, comprising the steps of:
    feeding an inert gas into a vertical reaction-tube comprising an inner tube and an outer tube, which tubes form therebetween an annular channel communicating with a tubular space of the inner tube;
    introducing a reaction gas into the vertical reaction-tube;
    exhausting the inert gas through the annular channel formed between the inner tube and the outer tube at a bottom portion of said vertical reaction-tube; and,
    heating the vertical reaction-tube by means of a heating furnace;
    heat treating a wafer or wafers in said vertical reaction-tube under a presence of the reaction gas;
    said method further comprising the steps of:
        vertically displacing said wafer or wafers upward and then positioning said wafer or wafers in the vertical reaction-tube at a level substantially the same as or above the top end of the inner tube;
        introducing said reaction gas into said vertical reaction-tube at or above the position of the wafer or wafers;
        causing a reaction with the reaction gas to occur on said wafer or wafers positioned as above;
        causing said inert gas to flow from a bottom portion of the inner tube toward said wafer or wafers positioned as above, thereby essentially impeding inflow of said reaction gas into the inner tube.

2. A method according to claim 1, further comprising the steps of:
    withdrawing said wafer or wafers from the vertical reaction-tube; and,
    subsequently, cleaning the inner space of said vertical reaction-tube by means of a plasma.

3. A method according to claim 2, wherein said plasma is generated by energizing rod-form electrodes, which extend in the axial direction of said vertical reaction-tube at least above the position of the wafer or wafers, and, are permanently positioned between the heating furnace and the outer tube.

4. A method according to claim 1 or 2, further comprising a step of:
    defining an annular space for the flow of the inert gas inside of the top inner surface of the inner tube.

5. A method according to claim 4, wherein said annular space is formed between a wafer-holder and the top inner surface of the inner tube.

6. A method according to any one of claim 1, 2 or 3, wherein said step of heating the vertical reaction-tube is carried out by radiant heat from an electric resistance heater of said heating furnace and reflective light from a reflecting metal surface, which is provided outside of said electric resistance heater and reflects the radiant heat of said electric resistance heater.

7. A method according to claim 6, further comprising a step of:
    defining an annular space for the flow of the inert gas inside of the top inner surface of the inner tube.

8. A method according to any one of claim 1, 2 or 3, wherein said wafer or wafers is one wafer positioned horizontally.

9. A method according to claim 8, further comprising a step of:
    defining an annular space for the flow of the inert gas inside of the top inner surface of the inner tube.

10. A method according to any one of claim 1, 2 or 3, wherein said wafer or wafers are a plurality of wafers positioned horizontally, and said step of introducing the reaction gas is carried out by admitting the reaction gas from a side portion of the outer tube and withdrawing the reaction gas from the opposite side portion of the outer tube.

11. A method according to claim 8, further comprising a step of:
    defining an annular space for the flow of the inert gas inside of the top inner surface of the inner tube.

12. A method according to any one of claim 1, 2, or 3, wherein said wafer or wafers are a plurality of wafer or wafers positioned horizontally, and said step of introducing the reaction gas is carried out by admitting the reaction gas from a top portion of the outer tube and causing the reaction gas to flow downward.

13. A method according to claim 11, further comprising a step of:
    defining an annular space for the flow of the inert gas inside of the top inner surface of the inner tube.

14. A method according to any one of claim 1, 2 or 3, further comprising the step of:
    prior to the step of flowing said inert gas from the bottom portion of the inner tube and the step of vertically displacing a wafer or wafers, elevating a temperature of said heating furnace to a reaction temperature.

15. A method according to claim 14, further comprising a step of heating said wafer or wafers to a preliminary heating temperature lower than the reaction temperature.

16. A method according to claim 15, wherein said preliminary heating is carried out by means of a preliminary heating furnace which is located below and concentrically to said heating furnace, between which furnaces an adiabatic plate is sandwiched.

17. A method according to claim 15, further comprising a step of rotating the wafer or wafers or wafer or wafers during reaction with the reaction gas.

18. A method according to claim 16, further comprising a step of:
    defining an annular space for the flow of the inert gas inside of the top inner surface of the inner tube.

19. A method according to claim 16, wherein said wafer or wafers is one wafer positioned horizontally.

20. A method according to claim 16, further comprising a step of:
    defining an annular space for the flow of the inert gas inside of the top inner surface of the inner tube.

21. A method according to claim 16, wherein said wafer or wafers are a plurality of wafers positioned horizontally, and said step of introducing the reaction gas is carried out by admitting the reaction gas from a side portion of the outer tube and withdrawing the reaction gas from the opposite side portion of the outer tube.

22. A method according to claim 16, wherein said wafer or wafers are a plurality of wafers positioned horizontally, and said step of introducing the reaction gas is carried out by admitting the reaction gas from a top portion of the outer tube and flowing the reaction gas downward.

23. A method according to claim 16, further comprising a step of rotating the wafer or wafers during reaction with the reaction gas.

24. A method according to claim 18, wherein said wafer or wafers is only one wafer positioned horizontally.

25. A method according to claim 18, further comprising the step of:

defining an annular space for the flow of the inert gas inside the top inner surface of the inner tube.

26. A method according to claim 18, wherein said wafer or wafers are a plurality of wafers positioned horizontally and said step of introducing the reaction gas is carried out by admitting the reaction gas from a side portion on the outer tube and withdrawing the reaction gas from the opposite side portion of the outer tube.

27. A method according to claim 18, wherein said wafer or wafers are a plurality of wafers positioned horizontally, and said step of introducing the reaction gas is carried out by admitting the reaction gas from a top portion of the outer tube and flowing the reaction gas downward.

* * * * *